(12) United States Patent
Kobata et al.

(10) Patent No.: US 7,764,207 B2
(45) Date of Patent: Jul. 27, 2010

(54) DIGITAL PROCESSOR

(75) Inventors: Tsukasa Kobata, Sayama (JP); Tsuyoshi Shiobara, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/225,566

(22) PCT Filed: Mar. 30, 2007

(86) PCT No.: PCT/JP2007/057727

§ 371 (c)(1),
(2), (4) Date: Oct. 27, 2008

(87) PCT Pub. No.: WO2007/114523

PCT Pub. Date: Oct. 11, 2007

(65) Prior Publication Data

US 2009/0115652 A1  May 7, 2009

(30) Foreign Application Priority Data

Mar. 31, 2006   (JP) ............................. 2006-100087

(51) Int. Cl.
*H03M 1/00* (2006.01)
(52) U.S. Cl. .................... 341/110; 341/118; 341/120; 341/131; 341/143; 341/155
(58) Field of Classification Search ................ 341/131, 341/143, 118, 120, 110
See application file for complete search history.

(56) References Cited

U.S. PATENT DOCUMENTS

| | | | | |
|---|---|---|---|---|
| 5,005,106 A | * | 4/1991 | Kiku | 361/818 |
| 5,739,727 A | * | 4/1998 | Lofter et al. | 331/11 |
| 5,903,857 A | * | 5/1999 | Behrens et al. | 702/190 |
| 6,157,271 A | * | 12/2000 | Black et al. | 332/127 |
| 6,211,747 B1 | * | 4/2001 | Trichet et al. | 332/128 |
| 6,268,814 B1 | | 7/2001 | Kolsrud | |
| 6,486,810 B1 | * | 11/2002 | Cooklev et al. | 341/143 |
| 6,799,532 B2 | * | 10/2004 | Sirkis et al. | 118/723 MW |
| 6,834,183 B2 | * | 12/2004 | Black et al. | 455/182.1 |
| 6,917,317 B2 | * | 7/2005 | Nagaso et al. | 341/131 |
| 7,015,853 B1 | * | 3/2006 | Wolff et al. | 341/155 |
| 7,224,299 B2 | * | 5/2007 | Somayajula | 341/131 |

(Continued)

FOREIGN PATENT DOCUMENTS

JP   3-283822   12/1991

(Continued)

*Primary Examiner*—Linh V Nguyen
(74) *Attorney, Agent, or Firm*—Jordan and Hamburg LLP

(57) ABSTRACT

An object of the present invention is to reduce spurious generation due to a malfunction of an A/D converter in a device performing digital processing by converting an analog signal high in cyclic characteristics to a digital signal with the A/D converter.

As a concrete solving means, for instance, in a frequency synthesizer of a certain system, the A/D converter is provided on an output side of a voltage controlled oscillator, and its output signal is given to a device performing digital processing to feed back the processing result to the voltage controlled oscillator through D/A conversion. In this case, the noise generated in the band noise generator is added to an input signal of the above-described analog/digital converter. This band noise is a band not affecting the digital signal processing performed by the device.

2 Claims, 15 Drawing Sheets

U.S. PATENT DOCUMENTS

| | | | |
|---|---|---|---|
| 7,394,418 B2 * | 7/2008 | Eikenbroek | 341/143 |
| 2002/0051503 A1 * | 5/2002 | Takahiko | 375/327 |
| 2002/0089438 A1 * | 7/2002 | Fwu | 341/118 |
| 2006/0119492 A1 * | 6/2006 | Kim | 341/143 |
| 2008/0284630 A1 * | 11/2008 | Kikugawa et al. | 341/155 |
| 2009/0021312 A1 * | 1/2009 | Kimura et al. | 331/34 |

FOREIGN PATENT DOCUMENTS

| | | |
|---|---|---|
| JP | 6-132825 | 5/1994 |
| JP | 2001-267922 | 9/2001 |

* cited by examiner (a)

(b)

(a) AFTER COUNTERMEASURE (b) BEFORE COUNTER MEASURE (a)

(b)

(a) OUTPUT OF CARRIER REMOVE
    (SPEED OF ROTATING VECTOR)

(b) OUTPUT OF INVERSE ROTATING
    VECTOR MULTIPLYING UNIT (c) OUTPUT OF TIME DIFFERENCE
    DETECTION UNIT FOR PHASE (a) INPUT OF CUMULATIVE ADDITION UNIT FOR PHASE DIFFERENCES (b) OUTPUT OF CUMULATIVE ADDITION UNIT FOR PHASE DIFFERENCES (c) OUTPUT OF LOOP FILTER (d) OUTPUT OF VCO

DIGITAL PROCESSOR

TECHNICAL FIELD

The present invention relates to a spurious reduction system of a digital processor obtaining analog signals through an analog/digital (A/D) converter, and is concerned with prevention of a mal function of the A/D converter especially in a PLL system frequency synthesizer

BACKGROUND ART

The digital processor of this sort includes, for instance, a radio communication device such as a cellular phone, a waveform analyzer, a frequency synthesizer and the like. The frequency synthesizer includes a device to which a phase locked loop (PLL) shown in FIG. 18 is applied, and further includes a phase comparison function configured with a programmable logic device (PLD). In this drawing, the PLL works such that it divides an oscillation output of a voltage controlled oscillator 101 into 1/N with a divider 102, inputs the divided output into one input terminal of a phase comparator 103, and at the same time, divides an oscillation output 104 of, for instance, a crystal oscillator 104 being a reference signal generator into 1/M with a divider 100, inputs the divided output into the other input terminal of the phase comparator 103, and feeds back the compared signal to the voltage controlled oscillator 101 via a loop filter 105. When this PLL is locked, a frequency $f_{vco}$ of the oscillation output of the voltage controlled oscillator 101 and a frequency $f_0$ of the oscillation output of the quartz oscillator 104 become $f_{vco}=(N/M) f_0$, because there is a relation of $f_{vco}/N=f_0/M$. Since the divider 102 is configured with a programmable counter, and is able to set a frequency divider ratio N with digital data from outside, it becomes possible to set the frequency of the $f_{vco}$ without restraint. The frequency synthesizer is able to switch an output frequency of the voltage controlled oscillator 101 in a wide frequency range in steps of 1 MHz or the like by changing the frequency divider ratios of the dividers 100 and 102 with an outside circuit, and further, by forming the PLL in a multiple configuration.

In the frequency synthesizer taking the above PLL system, when a phase comparison function of the phase comparator 103 is conducted in a digital processing, the oscillation output of the voltage controlled oscillator 101 is converted into a digital signal at the A/D converter, the digital signal and the oscillation output (clock signal) of the quartz oscillator 104 are captured into a digital processing circuit to perform a phase comparison processing, and the comparison result is restored to an analog signal at a D/A converter to be a voltage controlled signal of the voltage controlled oscillator 101.

However, a spurious noise appears in the above-described frequency synthesizer, which results in performance deterioration of the device. The reason for this is considered that a large holding current and a small holding current in the A/D converter are repeated at a certain cycle, which is responsible to this deterioration.

Meanwhile, in Patent Document 1, there is a description that M-series pseudo-random numbers uncorrelated to each other are generated, and digitally added. Then, they are subjected to D/A conversion, and analogously added to an analog input signal to be an input of the A/D converter. However, since a band noise generator is not used, a considerably large output level is generated even within an output frequency of the A/D converter. The circuit is used in the device, and if it is used for restraint of spurious generation with the advance of charge/discharge of the holding current of the A/D converter, it affects the signal processing at the subsequent stage.

Patent Document 1:
  Japanese Patent Application Laid-open No. Hei 6-132825

DISCLOSURE OF THE INVENTION

An object of the present invention is to provide a digital processor that reduces spurious generation due to a malfunction of an A/D converter in a device conducting digital processing by converting an analog signal of high cyclic characteristics into a digital signal at an A/D converter A digital processor of the present invention includes an analog/digital converter into which an analog input signal of high cyclic characteristics is input;

a band noise generator generating noise in a prescribed frequency band;

an adder for adding noise generated in the band noise generator to the input signal of the above-described analog/digital converter; and a digital processing unit executing digital processing based on a digital signal converted by the above-described analog/digital converter, in which the frequency band of the noise outputted from the above-described noise generator is a band not affecting the digital signal processing in the above-described digital processing unit.

As a concrete example of the present invention, the following example can be cited for instance. A configuration further including: a voltage controlled oscillator provided on an input side of the above-described analog/digital converter; and a digital/analog converter provided on an output side of the above-described digital processing unit, in which a PLL loop is formed by feeding back a signal processed by the above-described digital processing unit to the voltage controlled oscillator via the above-described digital/analog converter. As such a PPL device, a frequency synthesizer can be cited for example.

As described above, according to the present invention, noise from the band noise generator is added to the input side of the A/D converter, and since the frequency band of the above-described noise is a band not affecting digital signal processing in the above-described digital processing unit, it is possible to reduce spurious generation due to a malfunction of an A/D converter to which an analog signal of high cyclic characteristics is inputted.

BEST MODE FOR CARRYING OUT THE INVENTION

Figure 1:
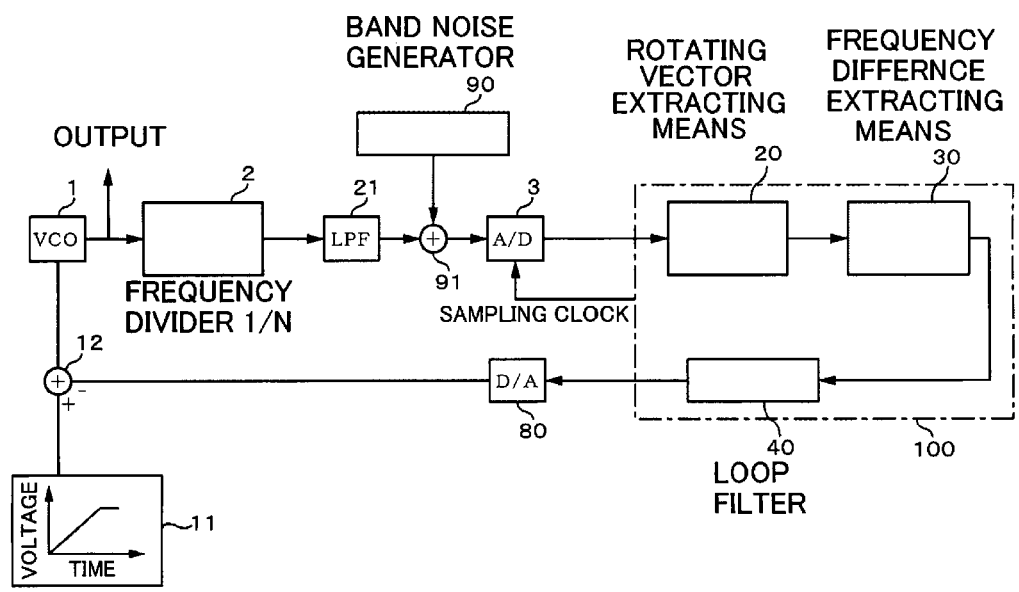
FIG. 1 is a functional block diagram showing an embodiment of the present invention.

FIG. 1 is a view showing an embodiment in which a digital processor of the present invention is applied to a frequency synthesizer. Although the frequency synthesizer operates based on a new principle, the present invention is not limited to be applied to this kind of frequency synthesizer, but can be widely applied to a device to A/D-convert an input signal of high cyclic characteristics and to perform digital processing of the output. Accordingly, an outline of the new frequency synthesizer will be explained only simply at the time before an explanation of the present invention, and a detailed configuration of the frequency synthesizer will be described after completion of the explanation of the present invention.

First, an operation principle of the frequency synthesizer will be briefly explained referring to FIG. 1. In FIG. 1, "1" is a voltage controlled oscillator as a voltage controlled oscillation unit, which outputs a frequency signal which is a rectangular wave having a frequency corresponding to a supplied voltage. The frequency signal from the voltage controlled oscillator 1 is divided in 1/N (N is an integer) by a frequency dividing means 2, and converted into a sine wave further to be converted into a digital signal. The conversion corresponds to processing to extract a rotating vector rotating at a frequency (speed) corresponding to a frequency of the above-described frequency signal by a rotating vector extracting means 20.

A frequency difference extracting means 30 at the subsequent stage of the rotating vector extracting means 20 extracts the difference between a frequency of the above-described rotating vector and a frequency fr of the rotating vector when an output frequency of the voltage controlled oscillator 1 becomes a set frequency. As a method of extracting the frequency difference, for instance, a method can be cited, in which an inverse rotating vector rotating at a frequency fr in the opposite direction to the rotational direction of a rotating vector extracted by the rotating vector extracting means 20 when the output frequency of the voltage controlled oscillator 1 becomes a set frequency is prepared, the above-described rotating vector and the inverse rotating vector are multiplied and a frequency difference therebetween is extracted.

It is also possible that the frequency of the rotating vector is reduced in some extent with an inverse rotating vector and a remaining frequency difference portion, for instance, the speed of a rotating vector may be detected with an approximate expression. Taking an example to be more concrete compared with such an example, adjustment to make the frequency of a rotating vector coincide with fr (adjustment step to extract a frequency difference by the frequency difference extracting means 30) is divided into rough adjustment and fine adjustment. Then, among frequencies made of integral multiples of frequency increment fa for the rough adjustment, a frequency n·fa (n is an integer) which is closest to the frequency of the above-described rotating vector when the output frequency of voltage controlled oscillator 1 becomes a set value is calculated in advance, an inverse rotating vector inversely rotating at the frequency n·fa is multiplied by the above-described rotating vector, and a very slowly rotating vector of frequency obtained by deducting the frequency of the inverse rotating vector from the frequency of the above-described rotating vector is extracted. Then, among integral multiples of frequency increment fb for the fine adjustment which is smaller than the above-described frequency fa, a frequency m·fb (m is an integer) which is closest to the difference between fr and the above-described frequency n·fa is calculated, the difference between the frequency of the above-described very slowly rotating vector and the frequency m·fb is extracted, and thus, the difference between the frequency of a rotating vector obtained by the rotating vector extracting means and fr is determined.

A series of the above calculations is performed in a parameter output unit (not shown). Note that when the adjustment step to extract the frequency difference in such a manner is divided into the rough adjustment and the fine adjustment, there is a merit that an accurate frequency difference can be obtained when a frequency of a rotating vector comes close to fr, and there is a merit that calculation of frequency detection becomes simple. This will be clear by a concrete example to be described later in FIG. 8.

The voltage corresponding to a frequency difference extracted by the frequency difference extracting means 30 is negatively fed back from a loop filter 40 being an integrating means to the input side of the voltage controlled oscillator 1, and an input voltage of the voltage controlled oscillator 1 is deducted from a voltage output unit 11 for frequency pull-in by this amount of voltage. In other words, when starting the device, the voltage for the frequency pull-in is supplied to the voltage controlled oscillator 1, and when the loop operates, a voltage corresponding to the above-described frequency difference is integrated in the loop filter 40, a voltage corresponding to the integrated value is added to be inputted into the voltage controlled oscillator 1, and the above-described frequency difference becomes small as the output frequency comes close to the set frequency. Then, the manner of the increase in the integrated value becomes small, and when the above-described frequency. difference comes to zero, the PLL is locked, so that the output frequency of the voltage controlled oscillator 1 is locked to the set frequency.

That is, when starting the voltage controlled oscillator 1, the input voltage is linearly increased, for instance, in relation to time, the output frequency is increased as the increase of the input voltage, and the frequency of the rotating vector extracted by the rotating vector extracting means 20 is increased. Then, when this frequency comes in a controllable range of the PLL, the difference between the frequency fr of the rotating vector at the time when the output frequency of the voltage controlled oscillator 1 comes to the set frequency and the frequency of the rotating vector, becomes small. As a result, an amount of the feed back becomes small. Accordingly, an increase in the output frequency of the voltage controlled oscillator 1 is suppressed, and the above-described frequency difference tends to converge to zero, so that the output frequency of the voltage controlled oscillator 1 tends to converge to the set frequency. When the PLL is locked in this manner, the output frequency of the voltage controlled oscillator 1 is to be locked to the set frequency.

Actually, since it is enough to select a frequency divider ratio according to the magnitude of a set frequency, it becomes possible to conduct minute frequency setting over a wide range of frequency band though it is only such an one-stage PLL, by taking an idea of a rotating vector into consideration.

A substantial part of the present invention will be described next. An oscillation output of the voltage controlled oscillator is input into a lowpass filter 21 via a frequency divider 2 to be extracted as a sinusoidal wave signal having only a fundamental wave component, and the sinusoidal wave signal is input into an A/D converter 3. To the A/D converter 3, a sampling clock of 40 MHz is input from a digital processing unit 100. In this example, the rotating vector extracting means 20, the frequency difference extracting means 30 and the loop filter 40 compose the digital processing unit 100, and the digital processing unit 100 is configured with a digital processor device, for instance, a field programmable gate array (FPGA).

Here, in the present embodiment, in order to reduce the spurious generation due to a malfunction of the A/D converter 3, a band noise generator 90 is provided, and an output of the band noise generator 90 is added to an analog output of the lowpass filter 21 with an adder 91 to designate this as a conversion input of the A/D converter 3.

Figure 2:
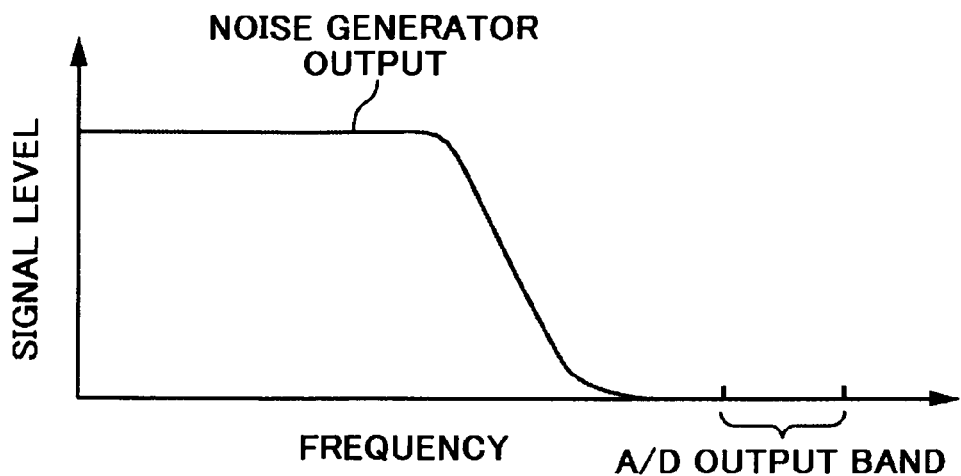
FIG. 2 is a frequency characteristic of a band noise generator.

As for a band noise generator 90, it is possible to cite a configuration that, for instance, a pseudo-random pulse is generated from digital processing to convert this to an analog signal, so that a band noise output close to a white noise is obtained. It is necessary for the frequency band of this noise to be a band not affecting digital signal processing in the above-described digital processing unit. Accordingly, it is necessary for the signal level of the above-described noise to be sufficiently small compared with the level of the input signal of the A/D converter 3 in the output frequency of the A/D converter 3. For its frequency characteristics, as shown in FIG. 2 for instance, it may have a frequency band at a position lower than the output frequency of the A/D converter 3, or conversely, it may have a frequency band at a position higher than the above-described output frequency. In addition, since a filter to eliminate low frequencies is generally provided on the subsequent stage side of the A/D converter 3, namely, in the FPGA being the digital processing unit 100, it is one of preferable embodiments to set the noise frequency band in a band removed by the filter.

Figure 3:
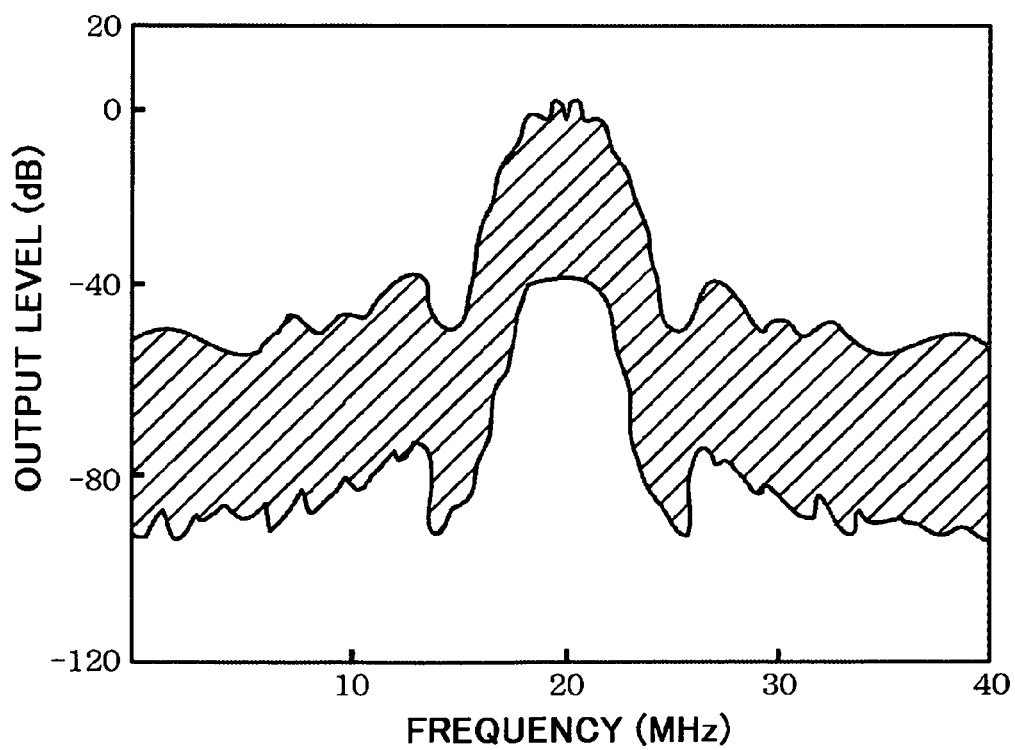
FIG. 3 is an example of a band noise output waveform of the band noise generator.

FIG. 3 shows an example of a band noise output waveform by the band noise generator 90, and it is possible to obtain a band noise whose noise center frequency is 20 MHz. Note that the portion with slant lines corresponds to a part to record a signal waveform, and its waveform image is expressed in black because the gap between pulses is narrower than the resolving power of the image.

As described above, noise is generated by the band noise generator 90, and it is possible to reduce spurious generation due to a malfunction of the A/D converter 3 by adding the noise to an analog input of the A/D converter 3. Hereinafter, this will be explained concretely.

Figure 4:
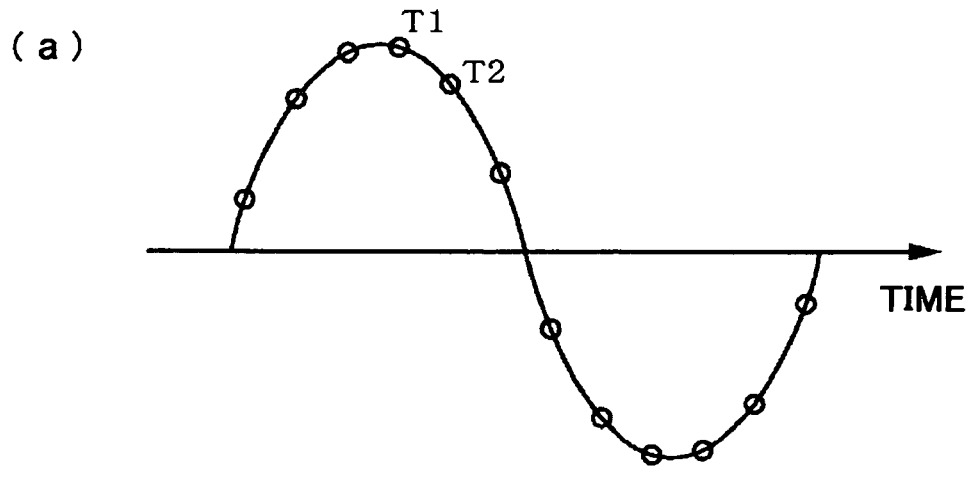
FIGS. 4A and 4B are explanatory views for explaining charge and discharge of a holding current of an A/D converter.
Figure 4:
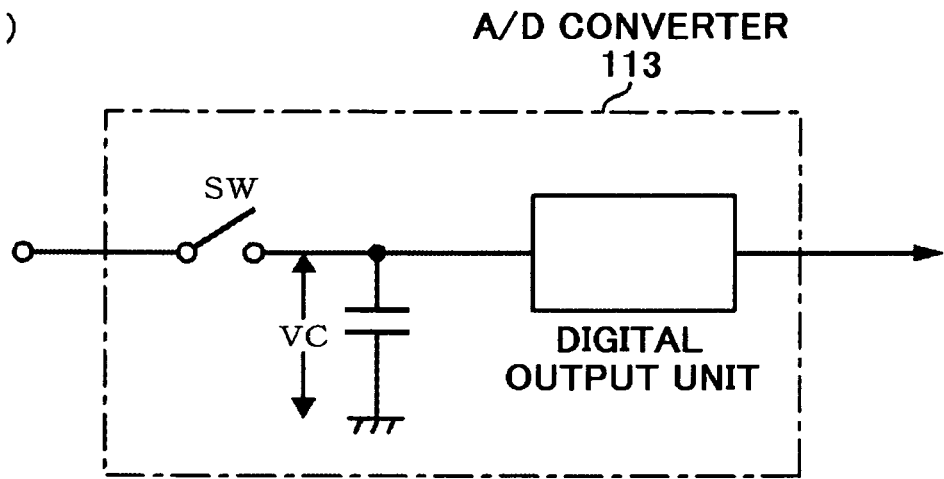

At the time of the sampling of an analog input signal at the A/D converter 3, an increase and a decrease of a holding charge current appear periodically when the input rotation is other than "0". FIG. 4 shows the timing of sampling of an input signal of the A/D converter 3 and an outline of the inside circuit of the A/D converter 3. At the timings T1 and T2, a switched SW is closed, and a discharge current passes through at the time of T2 because voltage VC is smaller at the time of T2 compared with that at the time of T1. This flow has cyclic characteristics, and the A/D converter 3 causes a malfunction as a consequence, due to the cyclic characteristics, which is considered to be a main cause of the spurious. Actually, an increase and decrease cycle (envelope) of this charging current and a spurious frequency are consistence with each other, and the spurious generation is assumed such that the increase and decrease cycle of the charging current periodically affects a sampling timing at the A/D converter, which causes the spurious.

Figure 5:
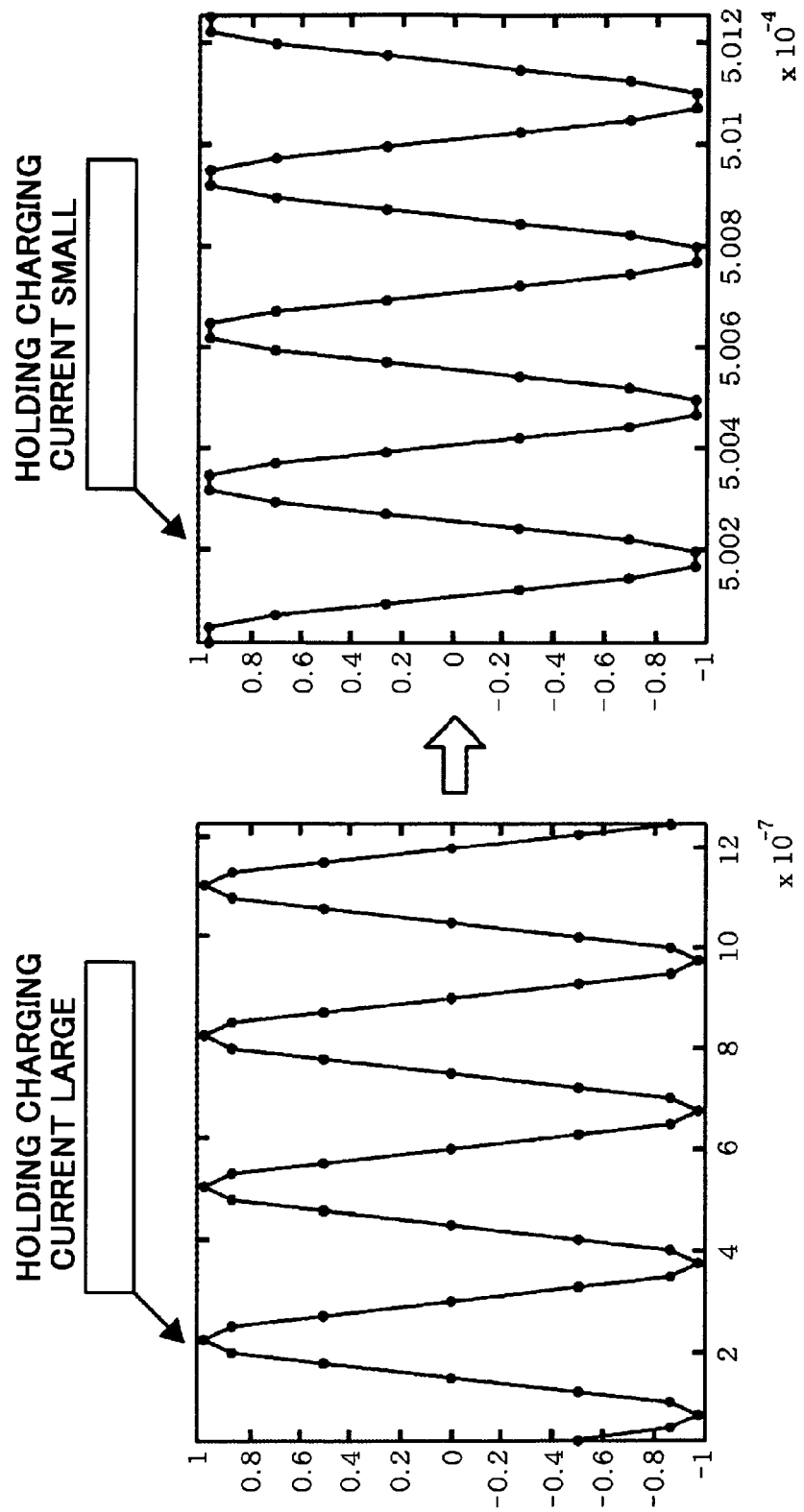
FIG. 5 is an example of a change in a holding charge current taken from an envelope input/40 MHz sample.
Figure 6:
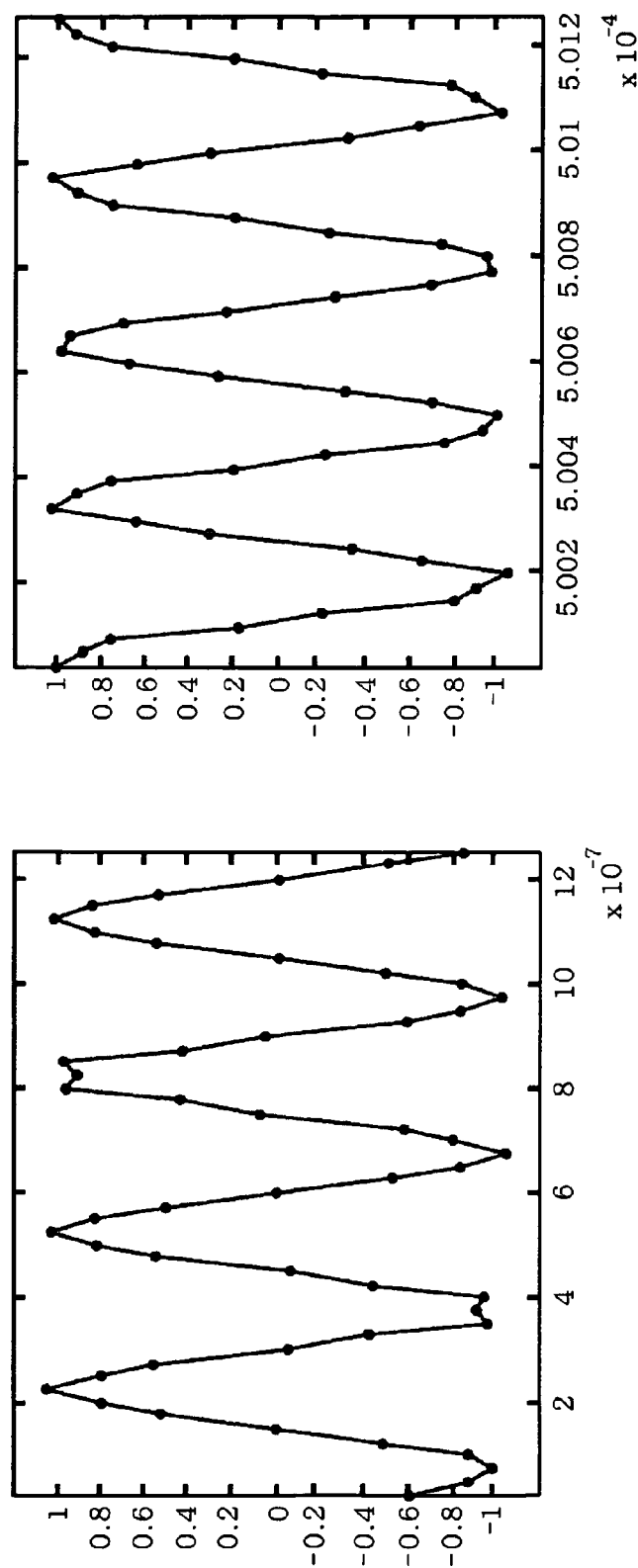
FIG. 6 is an example of reduction in cyclic characteristics of the holding charge current.

FIG. 5 shows large/small of the change in holding charge current with an envelope "36666750 Hz" input/40 MHz sample. These changes are repeated at a certain cycle, which results in malfunctions. In contrast to this, addition of noise from the band noise generator 90 according to the present embodiment diffuses the level of sampling points and eliminates the cyclic characteristics of the holding charge current as shown in FIG. 6 and spurious generation can be reduced as a result.

Figure 7:
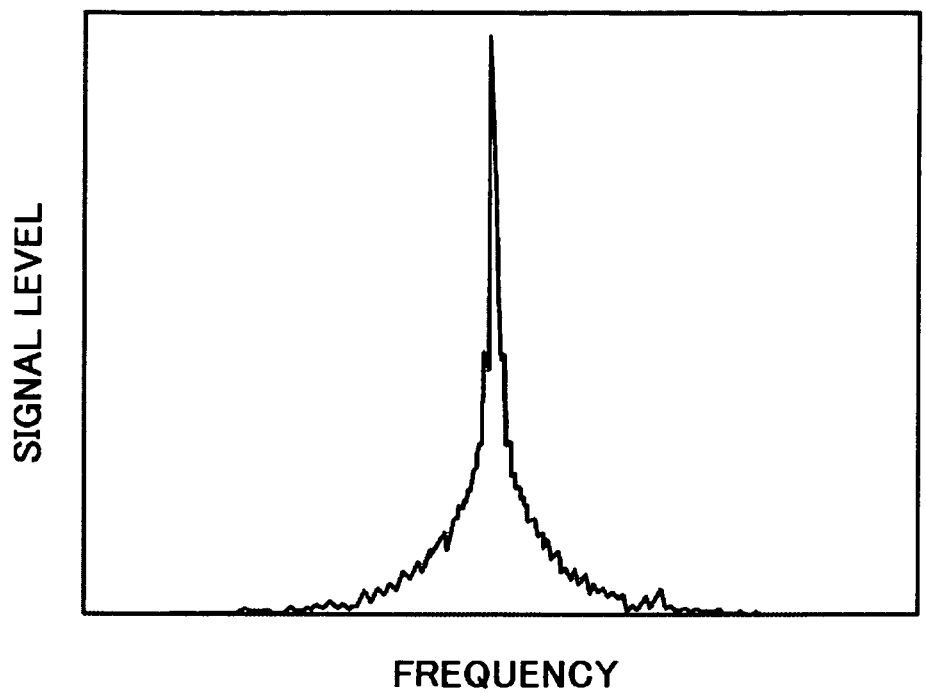
FIGS. 7A and 7B are waveform diagrams before and after taking countermeasures for spurious generation.
Figure 7:
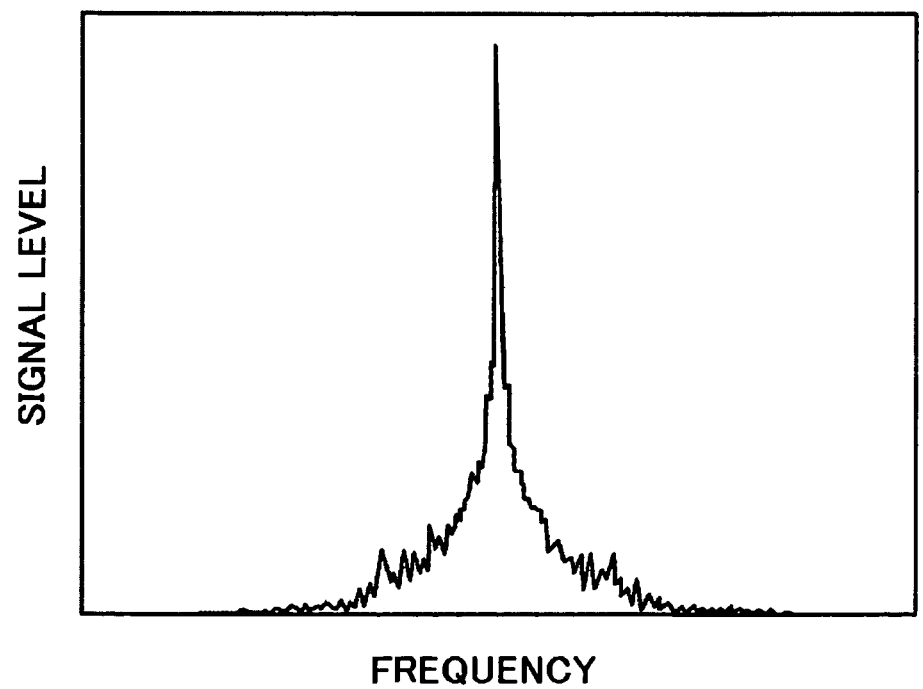

FIGS. 7A and 7B show a frequency spectrum in an output of the voltage controlled oscillator 1 in the embodiment in FIG. 1, where FIG. 7A is data to which noise is added, and FIG. 7B is data without noises. The center frequency is 888 MHz, and the frequency of added noise is 1 MHz. From this result, it is understood that the spurious can be reduced by adding a band noise.

Accordingly, according to the present embodiment, a band noise from which cyclic characteristics are eliminated by digital processing of a pseudo-random pulse is generated, and spurious generation due to a malfunction of the A/D converter 3 can be reduced only by addition of this to an analog input signal at the A/D converter 3. Note that the band noise is not limited to random noise in which frequency changes as time passes, but it may be noise having cyclic characteristics.

Although the following description is not included in the substantial part of the present invention, from a point of view to clarify the operation of the frequency synthesizer, the operation principle will be described in detail referring to FIG. 8 and thereafter. The voltage output unit 11 is configured such that, for instance, the output voltage is increased linearly to a prescribed voltage as time passes. The prescribed voltage is a voltage close to the voltage corresponding to the set frequency to be obtained from the voltage controlled oscillator 1, and is designated by a parameter output unit to be described later.

The means provided at the latter steps of the voltage controlled oscillator 1 will be explained in due order. "2" is a frequency divider composed of, for instance, a programmable counter, and the frequency divider ratio N (N is an integer) of the frequency divider 2 is determined by the parameter output unit to be described later. At the subsequent stage of the frequency divider 2, the lowpass filter 21 is provided as a means to convert a rectangular wave signal being a frequency signal from the frequency divider 2 into the sinusoidal wave signal.

"3" is the A/D (analog/digital) converter, and the sinusoidal wave signal being a frequency signal from the lowpass filter 21 is taken as a sample by a clock signal from a reference clock generator unit 31 to output the sampling value as a digital signal. The reference clock generator unit 31 outputs a clock signal that is a frequency signal of which frequency stability is extremely high for the purpose of sampling the above-described frequency signal.

A high-frequency signal specified by a digital signal obtained by the A/D converter 3 includes harmonics other than the fundamental wave. That is, when the sine wave having harmonic distortion is sampled, its harmonic component is affected by aliasing, and according to circumstances, it is supposed that the frequency of the fundamental wave and the frequency of the harmonics are overlapped above the frequency axis in a frequency spectrum. Then, it is necessary to avoid such overlap, and to extract a rotating vector corresponding to the output frequency of the voltage controlled oscillator 1 correctly at a later time.

In general, when the sinusoidal wave signal of a frequency f1 is sampled with a clock signal of a frequency fs, a frequency f2 as a result of the extracting is expressed by equation (1), where mod ( ) indicates a modulo function.

$$f2=|\mod(f1+fs/2,fs)-fs/2| \quad (1)$$

In the result of this extracting, since the frequency of n-th harmonics with respect to the frequency of the fundamental wave is expressed as n×(fundamental wave frequency), by putting this as f2 and by substituting this into the above-described equation (1), it is possible to calculate the frequency of the extracted harmonics. By using this calculation, it is possible to set a frequency fc of the high frequency signal from the frequency divider 2 and a sampling frequency (frequency of the clock signal) fs in a manner that the frequency of the fundamental wave and the frequency of the harmonics are not overlapped, for instance, the frequency divider ratio N is set so that fc becomes 36 MHz when the rotating vector is stopped, and fs is set to 40 MHz. Under this circumstance, the fundamental wave of a frequency signal specified by an output signal that is a digital signal from the A/D converter 3 is a sine wave of 4 MHz. Note that when fc/fs is adjusted to 9/10, the frequency of the fundamental wave and the frequency of the harmonics are not overlapped, but fc/fs is not limited to this value.

A carrier remove 4 is provided at the subsequent stage of the A/D converter 3. The carrier remove 4 corresponds to a means to execute quadrature detection to the sinusoidal wave signal specified by a digital signal from the A/D converter 3 using the sinusoidal wave signal of $\omega_0 t/2\pi$ (angular velocity is $\omega_0 t$) in frequency, and to extract a rotating vector rotating at a frequency equal to a difference between the frequency of the frequency signal specified by a digital signal at the A/D converter 3 and the frequency of the sinusoidal wave signal used for the detection. To be precise, it corresponds to a means for extracting the real part and the imaginary part of a complex number when the rotating vector is expressed in a complex expression.

Figure 9:
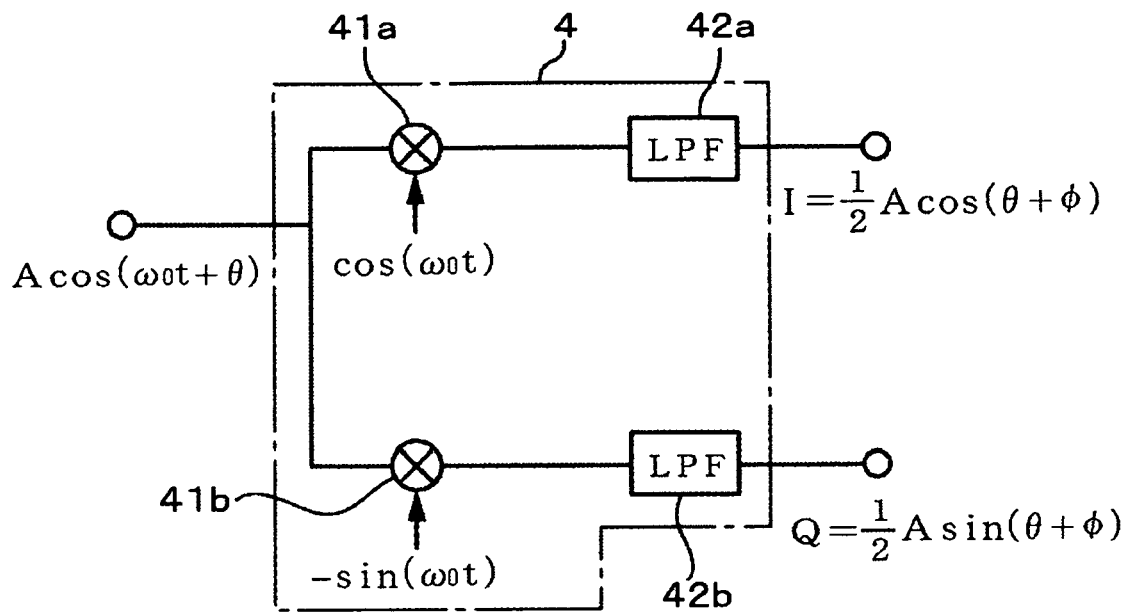
FIG. 9 is a configuration view showing a carrier remove used in the embodiment 2.

As for a detailed description about the carrier remove 4, the carrier remove 4 includes a multiplying unit 41a multiplying the above-described sinusoidal wave signal by cos ($\omega_0 t$) and a multiplying unit 41b multiplying the above-described sinusoidal wave signal by −sin ($\omega_0 t$), lowpass filters 42a and 42b respectively provided at the subsequent stages of the multiplying units 41a and 41b, as shown in FIG. 9. Accordingly, when the sinusoidal wave signal obtained at the A/D converter 3 is taken as A cos ($\omega_0 t+\theta$), an output of the multiplying unit 41a and an output of the multiplying unit 41b are expressed by equations (2) and (3) respectively.

$$A\cos(\omega_0 t + \theta) \cdot \cos(\omega_0 t) = \quad (2)$$
$$1/2 \cdot A\cos\theta + 1/2\{\cos(2\omega_0 t) \cdot \cos\theta + \sin(2\omega_0 t) \cdot \sin\theta\}$$

$$A\cos(\omega_0 t + \theta) \cdot -\sin(\omega_0 t) = \quad (3)$$
$$1/2 \cdot A\sin\theta - 1/2\{\sin(2\omega_0 t) \cdot \cos\theta + \cos(2\omega_0 t) \cdot \sin\theta\}$$

Here, since the frequency signal of $2\omega_0 t$ is removed by allowing the output of the multiplying unit 41a and the output of the multiplying unit 41b to pass through the lowpass filters 42a and 42b respectively, finally ½·A cos θ and ½·A sin θ are extracted from the lowpass filters 42a and 42b. In the actual digital processing in the lowpass filters 42a and 42b, a moving average of plural consecutive data, for instance six data is calculated, on the time-series data outputted from the multiplying units 41a and 41b.

When the frequency of the sinusoidal wave signal obtained in the A/D converter 3 and the frequency of the sinusoidal wave signal used for the quadrature detection are equal, a time function is not included in the output. Therefore, the rotating vector obtained in the carrier remove 4 is stopped. Meanwhile, when the frequency of the sinusoidal wave signal expressed by A cos ($\omega_0 t+\theta$) changes, A cos ($\omega_0 t+\theta$) becomes A cos ($\omega_0 t +\theta+\omega_1 t$). Accordingly, ½·A cos θ becomes ½·A cos(θ+$\omega_1$t), and ½·A sin θ becomes ½·A sin(θ+$\omega_1$t). That is, the outputs obtained from the lowpass filters 42a and 42b are the real part (I) and the imaginary part (Q) which are complex expression of the vector rotating at a speed of the frequency of the signal corresponding to the amount of change ($\omega_1$t) in frequency of the sinusoidal wave signal [A cos ($\omega_0 t+\theta$)], in other words, at a speed of the differential ($\omega_0 t/2\pi$) between the frequency of a sinusoidal wave signal obtained by the A/D converter 3 and the frequency of a sinusoidal wave signal used in the quadrature detection. Note that since there is no meaning to use the word "frequency" and the word "angular velocity" in different ways appropriately in this specification, both are often used mixedly.

Figure 10:
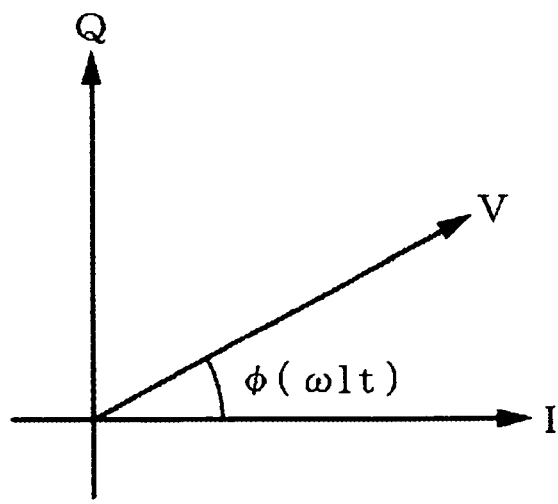
FIG. 10 is an explanatory view showing a rotating vector obtained in the carrier remove.

FIG. 10 is a view expressing the rotating vector V, and the rotating vector V is A in length, and the rotational speed is $\omega_1 t(=\phi)$ (frequency is $\omega_1 t/2\pi$). In this example, the frequency used for the quadrature detection is 4 MHz, and if the frequency of the sinusoidal wave signal obtained by the A/D converter 3 is 4 MHz, the rotational velocity of the rotating vector is zero. However, if it is shifted from 4 MHz, it rotates at a frequency (rotational speed) according to the shifted frequency difference.

An inverse rotating vector multiplying unit 5 is provided at the subsequent stage of the carrier remove 4. The inverse rotating vector multiplying unit 5 multiplies a rotating vector V obtained by the carrier remove 4 by an inverse rotating vector V' created in a parameter output unit 6. Using a visceral expression, this multiplication decelerates the speed of the rotating vector V by an amount of the speed of the inverse rotating vector V'. In other words, it is possible to obtain a rotating vector rotating at the difference in frequency between the rotating vector V and the inverse rotating vector V'.

Calculation in the inverse rotating vector multiplying unit 5 will be explained. The carrier remove 4 and the inverse rotating vector multiplying unit 5 are executed by calculation in a computer, and when a sampling value at a certain timing of the sampling in the calculation, for instance, the sampling value of the rotating vector V at n-th time is I(n)+jQ(n), the sampling value of the inverse rotating vector V' at n-th time is I'(n)+jQ'(n). The vector I+jQ obtained by multiplying both vectors together is {I(n)+jQ(n)}×{I'(n)+jQ'(n)}. When arranging the equations, equation (4) can be obtained.

$$I(n)+jQ=\{I(n)\cdot I'(n)-Q'(n)\cdot Q'(n)\}+j\{I(n)\cdot Q'(n)+I'(n)\cdot Q(n)\} \quad (4)$$

Figure 11:
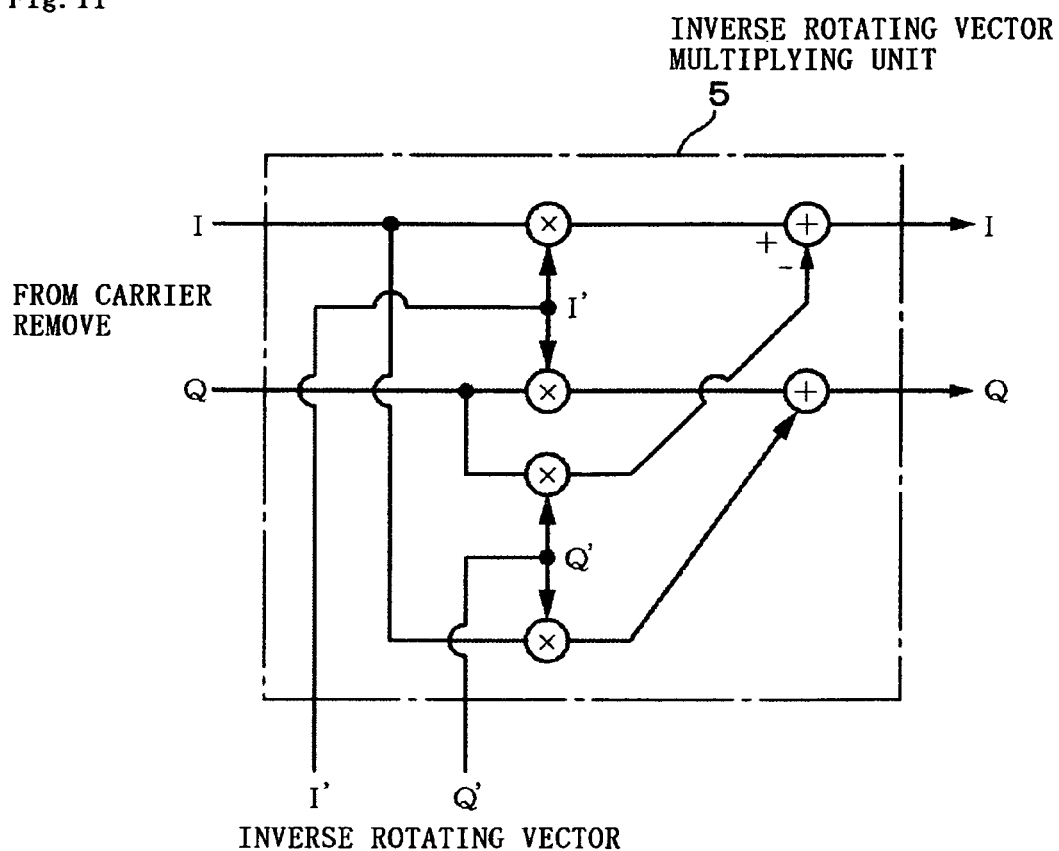
FIG. 11 is a configuration view showing a configuration of an inverse rotating vector multiplier unit.

FIG. 11 shows a configuration of the inverse rotating vector multiplying unit 5, which calculates equation (4).

Figure 12:
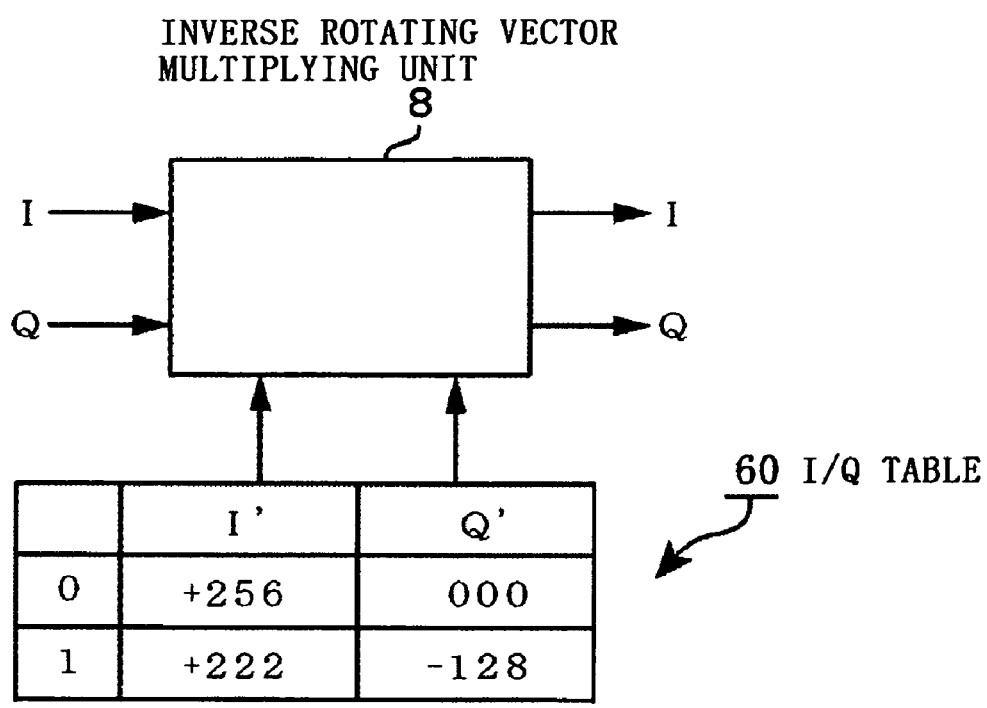
FIG. 12 is an explanatory view showing a data table for generating a inverse rotating vector in a parameter generation unit.

To generate the inverse rotating vector V' means to generate the values of a real part and an imaginary part of the vector, that is, to generate $\cos\phi'$ and $\sin\phi'$, where $\phi$ is the phase of the inverse rotating vector V' in a manner that the vector on a complex plane rotates inversely. FIG. 12 shows an I/Q table 60 on which pairs of $\cos\phi'$ and $\sin\phi'$ of a vector are arranged in order along the rotational direction of the vector, and the parameter output unit 6 is provided with the above-described I/Q table 60 in this example, addresses on the I/Q table 60 is read out at an increment or a decrement determined according to a set frequency of a designated voltage controlled oscillator 1, and is outputted to the inverse rotating vector multiplying unit 5. For instance, the addresses are read out one by one at the clock read-out timings from "0" to "11" and by returning to "0" again, the vector is to make one turn clockwise on a complex plane in 12 clocks. If the addresses are read at every other time by making the increment to be 2, the speed of the vector is doubled. It is possible to determine whether the address should be read out at the increment or at the decrement by the direction of rotation of the rotating vector V extracted by the carrier remove 4. Thus, the inverse rotating vector V' inverse rotating with respect to the rotating vector V can be created. Note that the I/Q table 60 in FIG. 12 is diagrammatically prepared to make the understanding of the present embodiment easy, and it is not intended to list a preferable preparation example for the actual table.

As for the blocks so far in FIG. 8, description will be made for a concrete series of calculations. When the output frequency of the voltage controlled oscillator 1 is fvco, the frequency divided by the frequency divider 2 is $f_{vco}/N$. In the A/D conversion unit 3, since a frequency is sampled by a clock signal having a frequency of fs, the frequency of a frequency signal specified by the digital signal obtained by the A/D conversion unit 3 is fs−(fvco/N). Since fs is 40 MHz in this example, it is 40 MHz−(fvco/N). Since the frequency ($\omega_0 t/2\pi$) of the sinusoidal wave signal used for wave detection in the carrier remove 4 is 4 MHz, the frequency of the rotating vector V extracted from the carrier remove 4 is 40 MHz−(fvco/N)−4 MHz.

It is controlled such that when the output frequency fvco of the voltage controlled oscillator 1 comes to its set frequency, the frequency difference between the frequency of the rotating vector V and the above-described frequency fr is zero. Since if (fvco/N) is 36 MHz, the rotating vector V is stoppeded (because the frequency is zero). In such a case, the PLL is locked by setting the frequency of the inverse rotating vector V' to be zero, and the output frequency fvco of the voltage controlled oscillator 1 becomes equal to a set frequency. However, since such a case can be obtained at only one point, actually, the rotating vector V extracted from the carrier remove 4 rotates at a certain speed. Accordingly, it becomes necessary to generate the inverse rotating vector V' to stop the rotating vector V. However, since a series of calculation is performed with a software, it is a requirement for design that a memory size to store data for generating the inverse rotating vector V' be as small as possible.

From this point of view, if the set frequency of the voltage controlled oscillator 1 is fset, it is preferable for fset/N be close to 36 MHz as much as possible, and in this example, in the parameter output unit 6, an integer causing fset/N to be as close to 36 MHz as possible is operated, so that the integer is used as the frequency divider ratio N of the frequency divider. By this procedure, the frequency of the inverse rotating vector V' for stopping the rotating vector V extracted from the carrier remove 4 gets a value smaller than 4 MHz, and it is possible to generate the inverse rotating vector V' with small amount of data.

A concrete example of the frequency will be cited here. When the set frequency fset of the voltage controlled oscillator 1 is set to, for instance, 520,0001 MHz, the frequency divider ratio is 14 (N=14), when it is set, for instance, to be an integer the closest to fset/36 MHz. In this case, the frequency after frequency division when the output frequency of the voltage controlled oscillator is the set frequency fset is fset/14=37.1428642857143 MHz. When the frequency after frequency division is 36 MHz as described above, the frequency of the frequency signal specified by a digital value obtained at the A/D conversion unit 3 is 40 MHz−36 MHz=4 MHz, and the frequency of the rotating vector V obtained through the carrier remove 4 performing quadrature detection with the sinusoidal wave signal of 4 MHz is 4 MHz−4 MHz=0, in other words, the rotating vector V is stopped. Accordingly, the frequency signal of fset/14=37.1428642857143 MHz is digitized at the A/D conversion unit 3, and the frequency of the rotating vector V obtained by inputting of the frequency signal into the carrier remove 4 is 37.1428642857143 MHz−36 MHz=1.1428642857143 MHz.

Such a calculation is conducted at the parameter output unit 6 before starting the voltage controlled oscillator 1 by inputting the set frequency to the frequency synthesizer. The parameter output unit 6 refers to a memory (not shown) and selects a voltage value with which a frequency close to the set frequency is obtained. Through this procedure, the output voltage of the voltage output unit 11 rises toward the voltage value. When the frequency divider ratio N is set to 14, and the frequency of the inverse rotating vector V' is set to 1.1428642857143 MHz, the output frequency fvco of the voltage controlled oscillator 1 is increased till the frequency of the frequency signal obtained at the A/D conversion unit 3 becomes 1.1428642857143 MHz. When the frequency of the rotating vector V and the frequency of the inverse rotating vector V' are consistent with each other after a while, the PLL is locked and fvco converges to fset.

Figure 13:
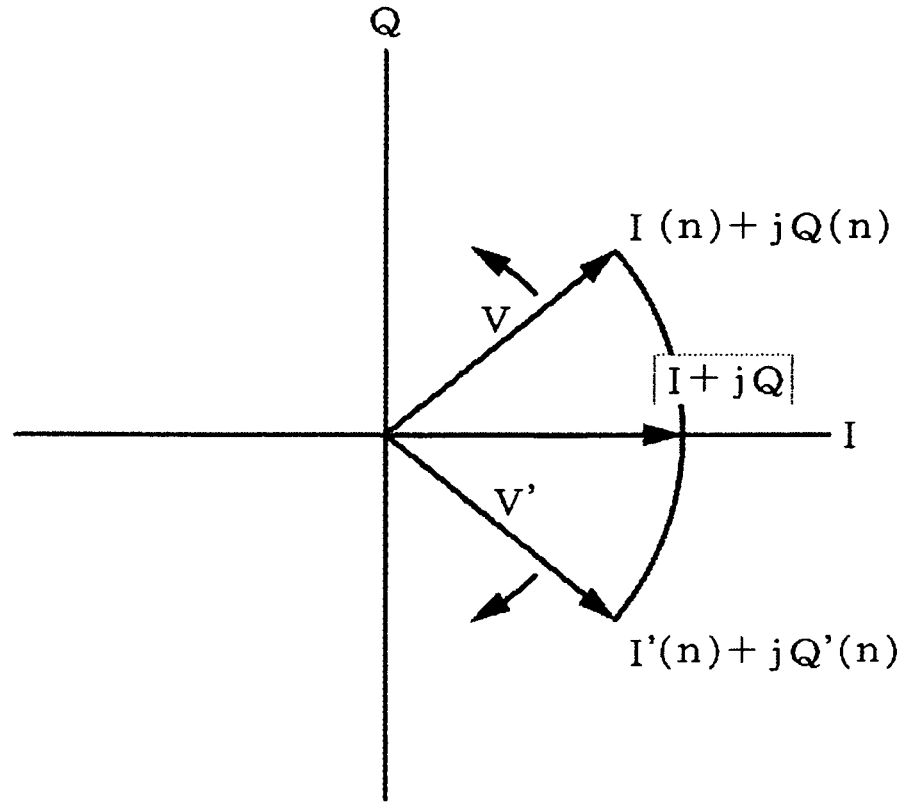
FIG. 13 is an explanatory view showing a manner of multiplying the rotating vector obtained in the carrier remove and the inverse rotating vector together by a frequency difference extracting means.

FIG. 13 is a view showing a state that the rotating vector V is inversely processed by the inverse rotating vector V' and stopped in an image.

The above-described operation is that in the case of stopping the rotating vector V relying on the inverse rotating vector V' only, and it is enough for this case to input a signal corresponding to the frequency of the rotating vector obtained at the inverse rotating vector multiplying unit 5 into a loop filter 8. However, with such a configuration, an amount of data for generating the inverse rotating vector V' would be considerably great. Accordingly, in an embodiment shown in FIG. 8, the frequency of the rotating vector V is decelerated to a certain extent by the inverse rotating vector V', and the remaining reduction in speed is left to the operation of a time difference detection unit 71, an addition unit 72 and a cumulative addition unit 73 for phase difference at the subsequent stage. In other words, rough adjustment of the frequency of the rotating vector V is performed in the inverse rotating vector multiplying unit 5, and the rotating vector V is stopped by performing fine adjustment of the rotating vector V at parts in the subsequent stages.

The frequency of the inverse rotating vector V' performing rough adjustment of the frequency of the rotating vector V can be set, for instance, in increments of 152.587890625 Hz. This is because, when the point number of the phase of the inverse rotating vector V' is set to 2 raised to 18th power, 40 MHz/2 raised to 18th power=152.587890625 Hz when data is sampled with 40 MHz. That is, the parameter output unit 6 calculates how many times of multiplication of the frequency increment fa is required to make it closest to 1142864.2857143 Hz (1.1428642857143 MHz) being the frequency of the above-described rotating vector V, when the minimum rough adjustment frequency (frequency increment fa) is 152.587890625 Hz.

The integer closest to 1142864.2857143 Hz/152.587890625 Hz is 7490, and the parameter output unit 6 determines the frequency n·fa (n is an integer) =7490·152.587890625 Hz=1142883.30078125 Hz, which is closest to the frequency of the rotating vector V when the output frequency of the voltage controlled oscillation unit 1 becomes the set value by determining this integer.

The parameter output unit 6 executes the following calculation. First, the frequency adjusted by the inverse rotating vector V' is deducted from the frequency of the rotating vector V, and 142864.2857143 Hz−1142883.30078125 Hz=19.0150669664145 Hz is determined.

Further, the frequency m·fb (m is an integer) which is closest to 19.0150669664145 Hz being the difference between the frequency of the above-described rotating vector V and the above-described frequency n·fa when the output frequency of the voltage controlled oscillation unit 1 becomes the set value among the integral multiple of frequency increment fb, among the integral multiple of the frequency increment 1 Hz in this example, for the fine adjustment smaller than the above-described frequency increment fa for the rough adjustment, is calculated. In this case, since fb is 1 Hz, m is 19, so that the adjustment worth of 19 Hz is executed by the part at the subsequent stage of the inverse rotating vector multiplying unit 5.

Figure 8:
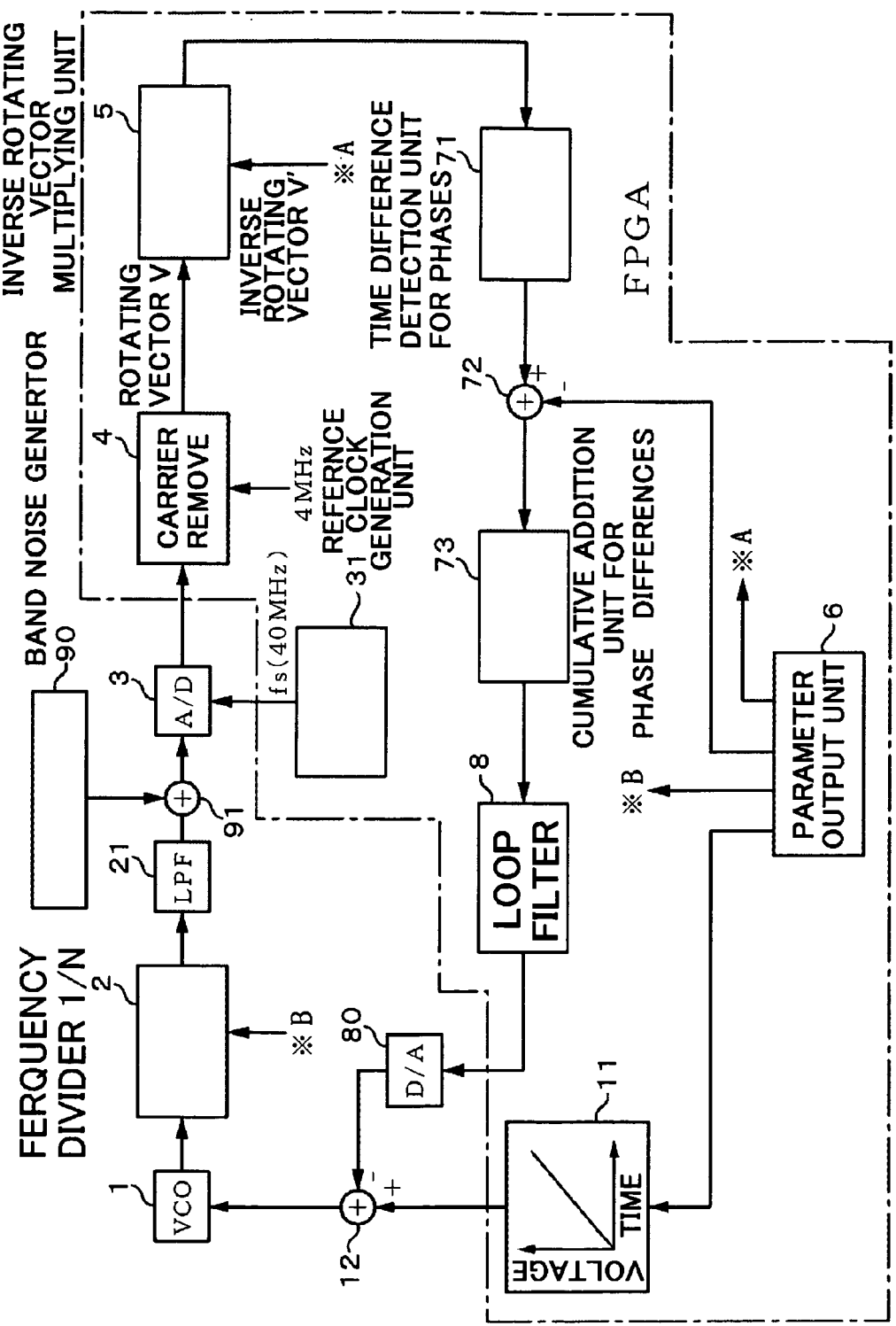
FIG. 8 is a basic configuration diagram of a frequency synthesizer relating to an embodiment 2 of the present invention.

Back to FIG. 8, "71" is the time difference detection unit for phases, "72" is the second addition unit, "73" is the cumulative addition unit 73 for phase differences, "8" is the loop filter, and 80 is the D/A (digital/analog) conversion unit.

Figure 14:
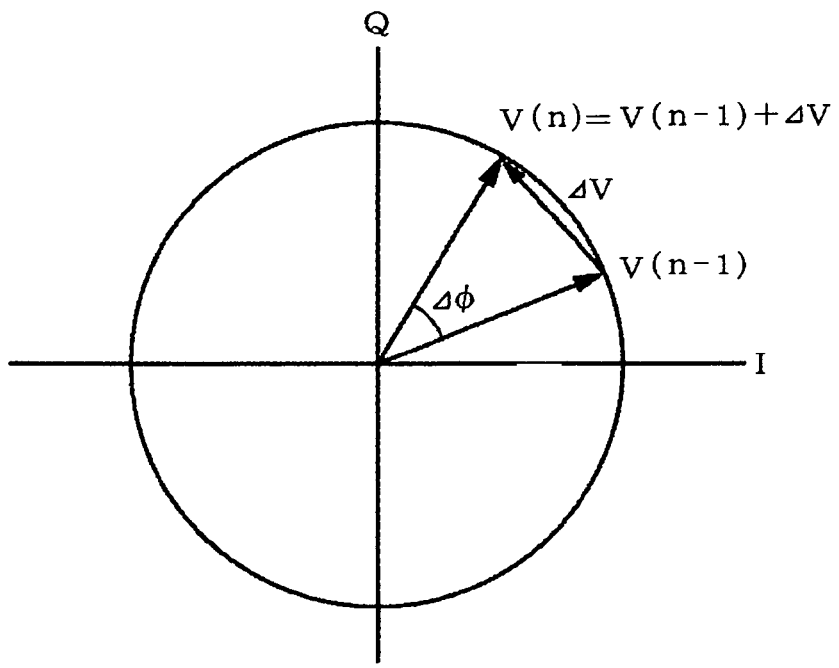
FIG. 14 is an explanatory view showing a phase difference between rotating vectors sampled at timings before and after.

Since the rotation of the rotating vector V is reduced in speed by the inverse rotating vector V', it is possible to determine a frequency (speed) of the rotating vector V with a simple approximate expression. On a complex plane as shown in FIG. 14, an angle $\Delta\phi$ formed with the rotating vector V(n−1) determined by the (n−1)-th sampling and the rotating vector V(n)=V(n−1)+$\Delta$V determined by the n-th sampling, namely, a phase difference $\Delta\phi$ between the rotating vectors V at both samplings is regarded as a length of $\Delta$V if the frequency of the rotating vector V is sufficiently small compared with the sampling frequency and $\theta$ can be regarded as $\theta=\sin\theta$.

Explaining the approximate expression to determine $\Delta$V, first, the phase difference $\Delta\phi$ is expressed by equation (5). Note that imag is an imaginary part, conj {V(n)} is a conjugate vector of V (n), and K is a constant.

$$\Delta\phi = K \cdot imag[\Delta V \cdot conj\{V(n)\}] \quad (5)$$

Here, as for a value I (real part of the rotating vector V) and a value Q (an imaginary part of the rotating vector V), assuming that values corresponding to n-th sampling are I(n) and Q(n) respectively, $\Delta$V and conj{V(n)} are expressed by equations (6) and (7) respectively in a complex expression.

$$\Delta V = \Delta I + j\Delta Q \quad (6)$$

$$conj\{V(n)\} = I(n) - jQ(n) \quad (7)$$

Note that, $\Delta$I is I(n)−I(n−1), and $\Delta$Q is Q(n)−Q(n−1). When equations (6) and (7) are substituted and arranged, $\Delta\phi$ is expressed by equation (8).

$$\Delta\phi = \Delta Q \cdot I(n) - \Delta I \cdot Q(n) \quad (8)$$

The above-described time difference detection unit 71 for phases is provided with a function to determine $\Delta\phi$ using the approximate expression in this manner. Since this $\Delta\phi$ is a value corresponding to the frequency of the rotating vector V reduced in speed by the inverse rotating vector multiplying unit 5, the time difference detection unit 71 for phases can be said to be a means (very slow speed vector detection means) outputting the frequency of the rotating vector reduced in speed.

Note that once the rotating vectors V(n−1) and V(n) are determined, as for the means for determining the angle $\Delta\phi$ in between, various mathematical methods can be used, and equation (5) being an approximate expression is listed only as an example. As a mathematical expression thereof, {V(n)+V(n−1)}/2 which is a vector $V_0$ connecting the middle point of a line connecting respective endpoints of V(n) and V(n−1) and the original point is used, and it is also possible to substitute the vector $V_0$ in place of V(n) in equation (5). The reason why such an equation (5) can be approximated is because $V_0$ and $\Delta$V are regarded to be orthogonal. Accordingly, the length of $\Delta$V can be handled as a value corresponding to the imaginary value of $\Delta$V when $V_0$ is judged to be a real axis.

Meanwhile, since the parameter output unit 6 determines the value of 19 Hz which is the amount corresponding to a frequency fine adjustment of the rotating vector V by calculation, the frequency of the rotating vector V detected at the time difference detection unit 71 for phases and 19 Hz worthy of the fine adjustment are compared at the addition unit 72, and the difference between the frequency of the rotating vector V and 19 Hz worthy of the fine adjustment is extracted, which is inputted into the cumulative addition unit 73. The output value from the cumulative addition unit 73 for phase differences is inputted into the loop filter 8.

The frequency synthesizer performs a processing to stop the rotating vector V as shown in FIG. 8. The processing is classified into rough suspension processing by so-called inverse rotation and processing to stop correctly the rotating vector V becoming a slow speed, and the latter processing is left to the time difference detection unit 71 for phases and the addition unit 72 in the example shown in FIG. 8. The inverse rotating vector multiplying unit 5, the time difference detection unit 71 for phases and the second addition unit 72 correspond to a frequency difference extracting means.

Figure 15:
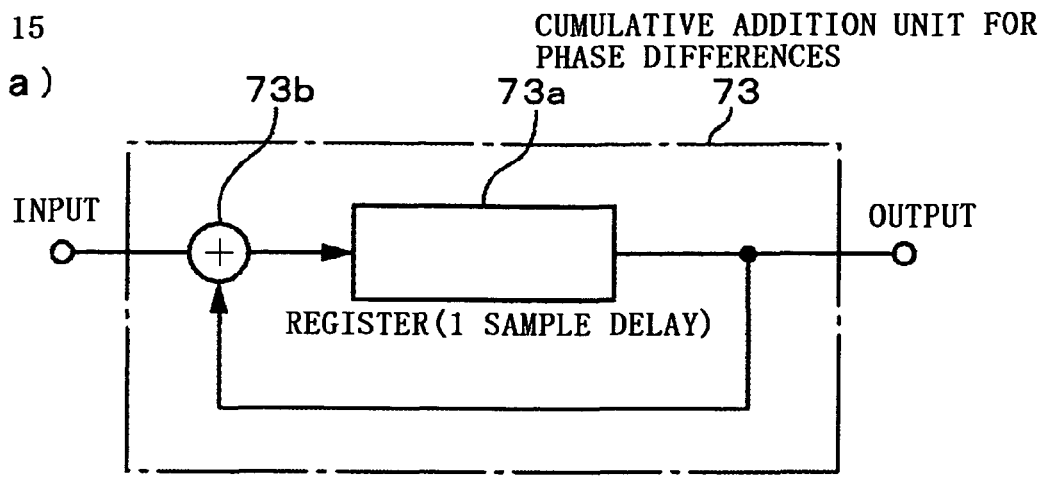
FIGS. 15A and 15B are configuration diagrams of a cumulative addition unit for phase differences and a loop filter in FIG. 6.
Figure 15:
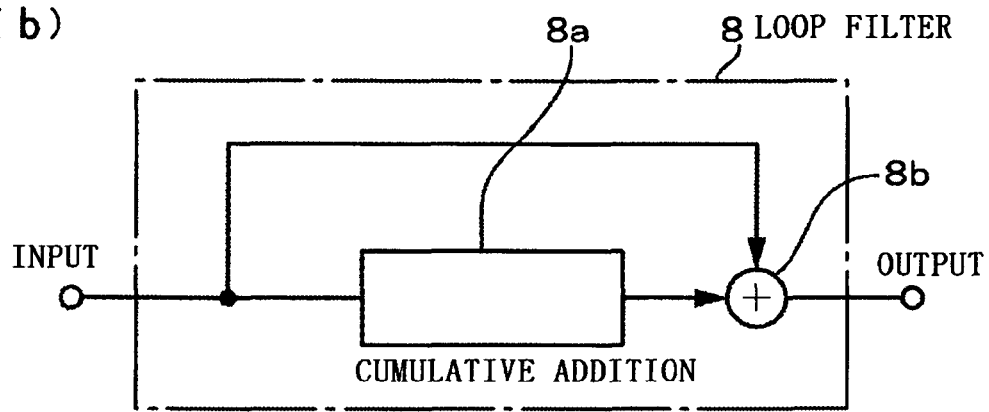

The cumulative addition unit 73 for phase differences is configured such that it stores an input value at the time of a certain sampling time to a resistor 73a as shown in FIG. 15A, outputs values stored till then at the time of next sampling to return them into the addition unit 73b for adding them to the input value, and the added value is inputted to the register 73a.

The loop filter 8 is configured to cumulatively add the input value at a cumulative addition unit 8a and to add the input value to its cumulative addition value at an addition unit 8b. The reason to input the input value to the addition unit 8b is because the output of the loop filter 8 is stabilized. The output voltage of the loop filter 8 is converted into analog voltage at a D/A conversion unit 80, and is inputted into a first addition unit 12 so as to deduct the output voltage from the output voltage of the voltage output unit 11.

In this example, a loop returning to the voltage controlled oscillation unit 1 from the voltage controlled oscillation unit via the frequency difference extracting means and the loop filter 8 forms a PLL. In addition, calculation processing of each part from the A/D converter 3 to the loop filter 8 is conducted by a software.

Figure 16:
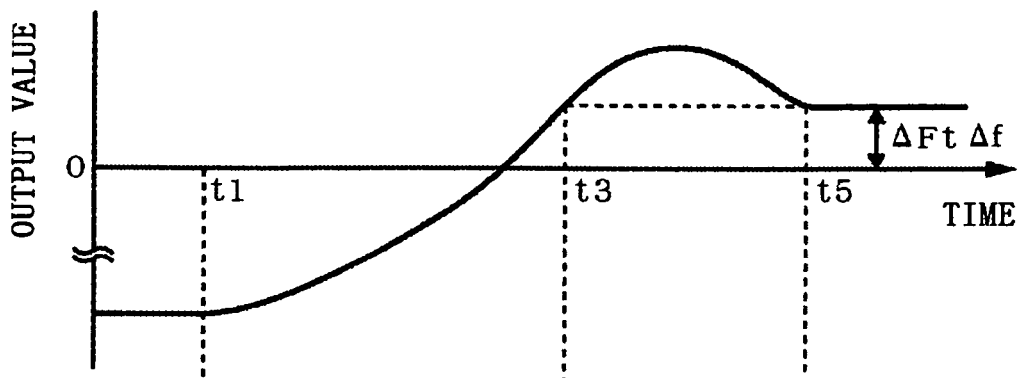
FIGS. 16A, 16B and 16C are time charts showing respective output levels of the carrier remove, a frequency difference extracting means and a time difference detection unit for phases in the embodiment 2.
Figure 16:
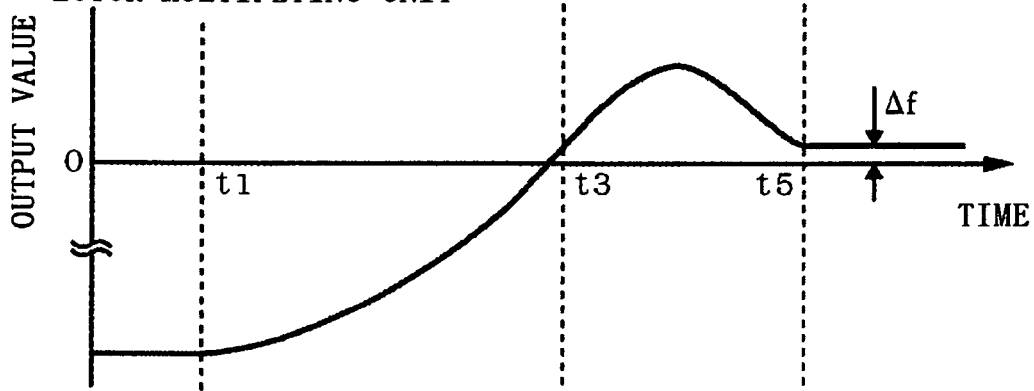
Figure 16:
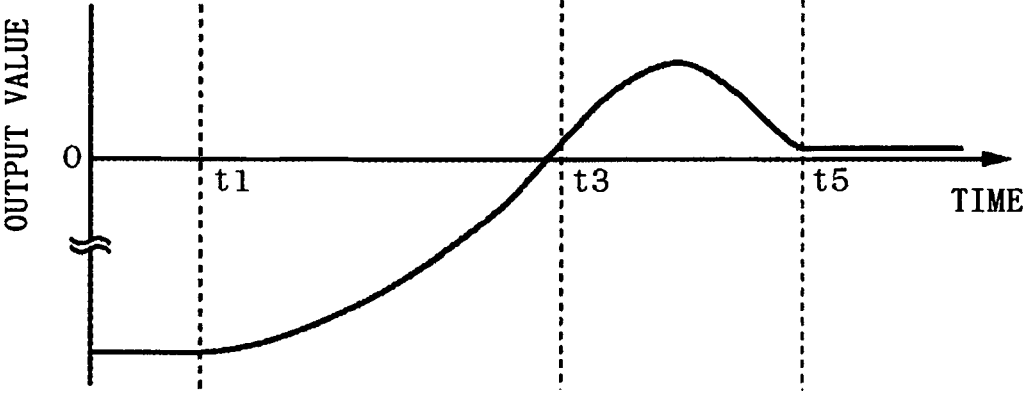
Figure 17:
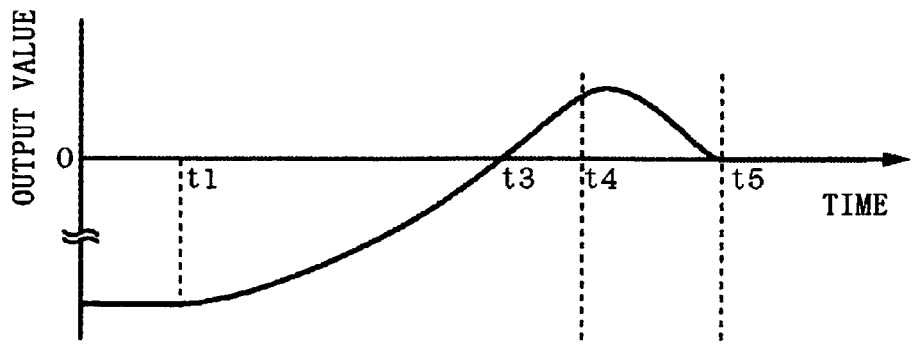
FIGS. 17A, 17B, 17C and 17D are time charts showing the respective input levels of the cumulative addition unit for the phase differences and the loop filter, and the respective output levels of the loop filter and the voltage controlled oscillator.
Figure 17:
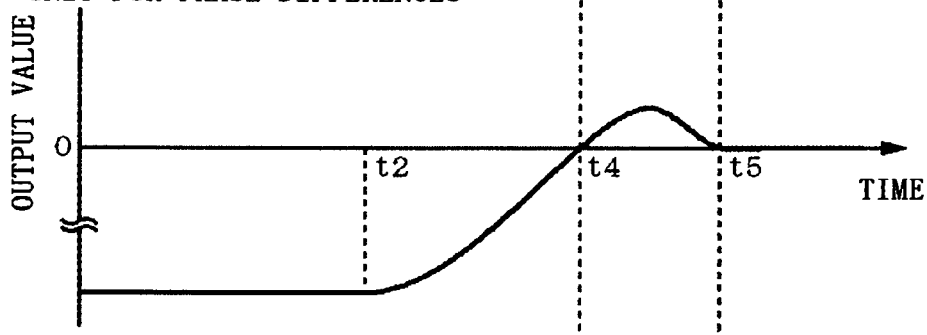
Figure 17:
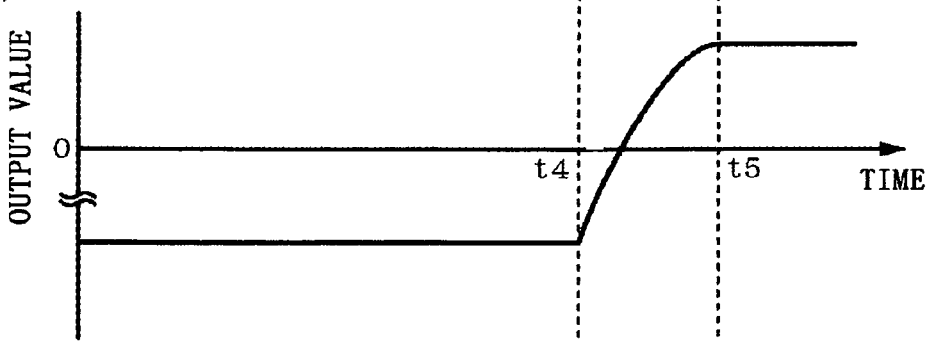
Figure 17:
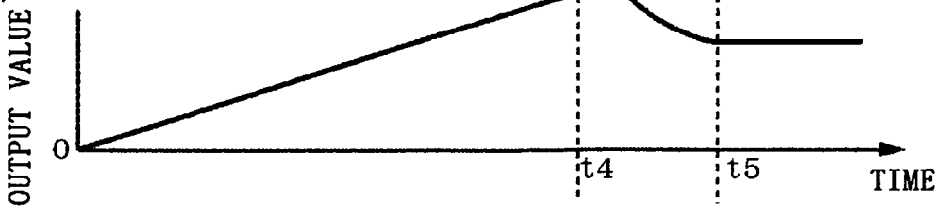
Figure 18:
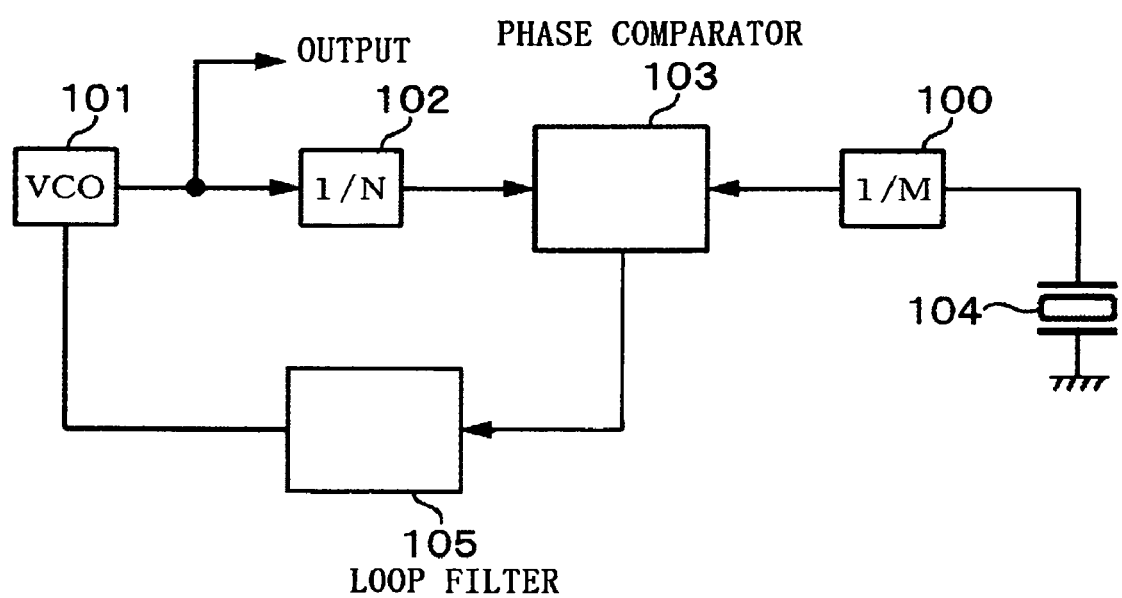
FIG. 18 is a functional block diagram of a conventional PLL.

Next, the whole operation shown in FIG. 8 will be explained referring to the time charts described in FIGS. 16 and 17. Note that though change patterns of a signal amount are diagrammatically described, the change pattern of the signal amount obtained by simulation is a more complicate pattern compared with the patterns in FIGS. 16 and 17. As described in the above-described concrete example, a set frequency fset of the voltage controlled oscillator 1 is supposed to be, for instance, 520.0001 MHz, and is inputted from an input unit (not shown). The parameter output unit 6 is provided with a table in which a relation between a set frequency of the voltage controlled oscillator 1 and a supplied voltage is written, and a set frequency closest to 520.0001 MHz in this table is selected.

Further, as described previously, the frequency divider ratio N=14 being an integer closest to fset/36 MHz, and the respective amounts obtained by dividing the frequency of the rotating vector V at the time the set frequency is obtained into a rough adjustment amount and a fine adjustment amount, are calculated. At this time, 1142883.30078125 Hz which is a rough adjustment amount of the frequency, in other words, the frequency of the inverse rotating vector, and the frequency 19 Hz of the rotating vector after inverse rotation processing which is a fine adjustment amount inputted into the second adder 72 are calculated.

When instructions to start is inputted from a input unit, the voltage corresponding to a set frequency is outputted from the voltage output unit 11 so as to rise linearly in relation to time for instance. Since voltage is supplied, the voltage controlled oscillator 1 outputs a frequency signal, and its frequency is increased. At the beginning, since the output frequency of the voltage controlled oscillator 1 is low, the frequency {40 MHz−(output frequency/N)} extracted at the A/D conversion unit 3 is large, which makes the frequency of the rotating vector V extracted by the carrier remove 4 a negative large value, and the output of each unit after the carrier remove 4 is kept at a negative lowest level till the time 1. When the output frequency of the voltage controlled oscillator 1 rises to a certain value, the extracting calculation of the rotating vector V from the carrier remove 4 becomes effective so that the frequency (speed) of the rotating vector V starts decreasing (refer to FIG. 16A).

In this explanation, when the rotating direction of the rotating vector V at the time the value of 40 MHz−(output frequency/N) is smaller than 4 MHz, in other words, at the time output frequency/N is larger than 36 MHz is called a positive direction, it means that the frequency of the rotating vector V rotating in the negative direction is getting decreased. At this time, as shown in FIG. 16B, the frequency of the rotating vector V to which the amount worthy of the inverse rotation which is an output of the inverse rotating vector multiplying unit 5 is also lowered. Accordingly, as shown in FIG. 16C, the output of the time difference detection unit 71 for phases also becomes smaller (negative speed becomes smaller), and as shown in FIG. 17A, the added value of the second addition unit 72 adding the above-described output (phase difference) and the amount of fine adjustment of the frequency also decreases. These changes are expressed in FIGS. 16 and 17 by showing changes into increase of respective values.

Further, since the output of the second addition unit 72, in other words, the input of the cumulative addition unit 73 for the phase differences is increased, the output of the cumulative addition unit 73 for the phase differences starts increasing at time t2 after time t1. The output frequency of the voltage controlled oscillator 1 is increased, the frequency after frequency division comes to 36 MHz, and it gets to the timing of stopping the speed of the rotating vector V extracted from the carrier remove 4. Here, taking the rough adjustment frequency to be ΔF (n·fa), and the fine adjustment frequency to be Δf (m·fb), the frequency of the rotating vector V extracted from the carrier remove 4 is still smaller than the amount worthy of frequency adjustment ΔF+Δf, and since its frequency difference (output of the second addition unit 72) is a negative value, the frequency of the rotating vector V is increased. Then, the frequency of the rotating vector V will be equal to the amount worthy of the above-described frequency adjustment ΔF+Δf at the time of t3, but it is further increased according to the history of the PLL up to that time.

When the output of the cumulative addition unit 73 for phase differences increases and turns to positive at the time t4 as shown in FIG. 17B, the output of the loop filter 8 starts increasing as shown in FIG. 17C. When the output of the loop filter 8 is changed from a negative voltage to a positive voltage, the output voltage from the voltage output unit 11 is lowered by the amount worthy of the output voltage of the loop filter 8 and is supplied to the voltage controlled oscillator 1. Accordingly, the output frequency of the voltage controlled oscillator 1 tends to be lowered as shown in FIG. 17D. Due to this movement, the speed of the rotating vector V starts decreasing, which leads to lower the output of the second addition unit 72. Accordingly, the output of the cumulative addition unit 73 for phase differences tends to be lowered. Thus, the output of the time difference detection unit 71 for phases is finally converged to Δf (in the above-described concrete example, it is 19 Hz) (FIG. 16C), and the output of the second addition unit 72, in other words, the frequency difference extracted by the frequency difference extracting means becomes zero. Then, the PLL is locked, the output frequency of the voltage controlled oscillator 1 is locked to 520.0001 MHz, the set frequency. Note that since the loop filter 8 has a complete integral function in this example, it converges to a positive direct current voltage. The time from starting the operation of the voltage controlled oscillator 1 till the PLL is locked is about 150 msec in simulation.

In the above frequency synthesizer, since the PLL is formed by extracting a rotating vector rotating at a speed (frequency) according to the output frequency of the voltage controlled oscillator 1, and by extracting the difference between the frequency of this rotating vector and the frequency of a rotating vector when the output frequency becomes a set frequency to feed it back to the voltage controlled oscillator 1, it is possible to perform a minute frequency setting over a wide frequency band at low noise. Then, at the time of extracting the frequency difference, the speed of the rotating vector is reduced using an inverse rotating vector inversely rotating at a rough frequency setting to detect the speed of the vector in its very slow speed rotation and by comparing its detected value with the amount of the fine adjustment calculated in advance, the difference is extracted. Accordingly, it is possible to detect the frequency of a rotating vector with a reduced data amount and with a simple calculation as described above, which makes it possible to configure a frequency synthesizer with a small memory size and small calculation load.

Note that the method of determining a frequency divider ratio N is not limited to the manner such that it is determined to be a frequency closest to a difference between the frequency of the reference clock signal used in the A/D conversion unit 3 and $\omega_0/2\pi$ used in the rotating vector extracting means when the set value of an output frequency of the voltage controlled oscillator 1 is divided by N.

Here, in the present embodiment, as shown in FIG. 8, a band noise generator 90 similar to that in embodiment 1 is provided, and this noise output is added to the output of the lowpass filter 21 in an adder 91 and this result is used as an analog input of the A/D converter 3. By this configuration, spurious generation due to a malfunction of the A/D converter 3 is reduced, and high performance at the frequency synthesizer can be realized.

Furthermore, in the above embodiment, though application to the PLL system frequency synthesizer has been shown, the similar operation and effect can be obtained by the application to a PLL which compares by digital processing, other digital processing device such as a wave analyzer.

The invention claimed is:

1. A digital processor, comprising:
a voltage controlled oscillator having a control voltage input and an output outputting an oscillating signal;
a band noise generator generating noise within a noise frequency band;
an analog/digital converter into which a first analog signal of high cyclic characteristics is input, said first analog signal being based on the oscillating signal and including the noise generated by the band noise generator, the analog/digital converter converting the first analog signal into a first digital signal representative of the oscillating signal and the noise generated by the band noise generator;
an adder for adding the noise generated in the band noise generator into the first analog signal input to said analog/digital converter; and
a digital processing unit executing digital processing on the first digital signal converted by said analog/digital converter to produce a processed second digital signal at a digital processing unit output;
a digital/analog converter provided on an output side of said digital processing unit and operating to produce a second analog signal based on the processed second digital signal, wherein:
the noise generated by said noise generator is limited to a band not affecting the digital signal processing in said digital processing unit; and
the first digital signal is used to effect control of the voltage controlled oscillator via both the digital processing unit and the digital/analog converter by control of the voltage controlled oscillation based on the second analog signal operating on the voltage control input of the voltage controlled oscillator to effect a phase locked loop control based on operation of the digital processing unit.

2. The digital processor according to claim 1, further comprising:
a divider operating on the oscillation signal from the voltage controlled oscillator; and
a lowpass filter passing an output of the divider to an input of the adder such that the adder produces said first analog signal of high cyclic characteristics.

* * * * *